United States Patent [19]

Matsumura et al.

[11] Patent Number: 5,225,663
[45] Date of Patent: Jul. 6, 1993

[54] HEAT PROCESS DEVICE

[75] Inventors: Kimiharu Matsumura; Eiichi Shirakawa, both of Kumamoto, Japan

[73] Assignee: Tel Kyushu Limited, Kumamoto, Japan

[21] Appl. No.: 793,509

[22] Filed: Nov. 18, 1991

Related U.S. Application Data

[63] Continuation of Ser. No. 366,455, Jun. 15, 1989, abandoned.

[30] Foreign Application Priority Data

Jun. 15, 1988 [JP] Japan .................. 63-148719

[51] Int. Cl.⁵ .................. H05B 3/26
[52] U.S. Cl. .................. 219/543; 219/468; 219/390
[58] Field of Search ............... 219/405, 411, 370, 468, 219/464, 465, 546, 543; 392/439; 338/308, 309

[56] References Cited

U.S. PATENT DOCUMENTS

| | | | |
|---|---|---|---|
| 2,021,661 | 11/1935 | Kisfaludy | 219/543 |
| 2,700,095 | 1/1955 | Needham | 219/543 |
| 2,803,566 | 8/1957 | Smith-Johannsen | 219/543 |
| 3,099,578 | 7/1963 | Hunter | 219/543 |
| 3,179,544 | 4/1965 | Smith-Johannsen | 219/543 |
| 3,686,473 | 8/1972 | Shirn | 219/219 |
| 3,811,934 | 5/1974 | Glaser | 219/543 |
| 4,203,025 | 5/1980 | Nakatani | 219/543 |
| 4,286,251 | 8/1981 | Howell | 338/309 |
| 4,296,309 | 10/1981 | Shinmi | 219/543 |
| 4,503,418 | 3/1985 | Belopolsky | 338/61 |
| 4,527,050 | 7/1985 | Kicherer | 219/543 |
| 4,536,645 | 8/1985 | Mio | 219/543 |
| 4,574,292 | 3/1986 | Takikawa | 219/543 |
| 4,679,056 | 7/1987 | Kobayashi et al. | 219/505 |
| 4,725,710 | 2/1988 | Ramus | 219/203 |
| 4,833,300 | 5/1989 | Bard | 219/543 |
| 4,882,466 | 11/1989 | Friel | 219/505 |

Primary Examiner—Teresa J. Walberg
Attorney, Agent, or Firm—Oblon, Spivak, McClelland, Maier & Neustadt

[57] ABSTRACT

A heat process device according to the present invention includes a film-like heating body serving as a heat source for a heat transfer plate on which an object to be processed is mounted and heated. Therefore, the heat process device can be excellent in controlling the heating temperature. It can also apply a uniform heat process to the object. Further, it can be made small in size and easy to operate.

5 Claims, 7 Drawing Sheets

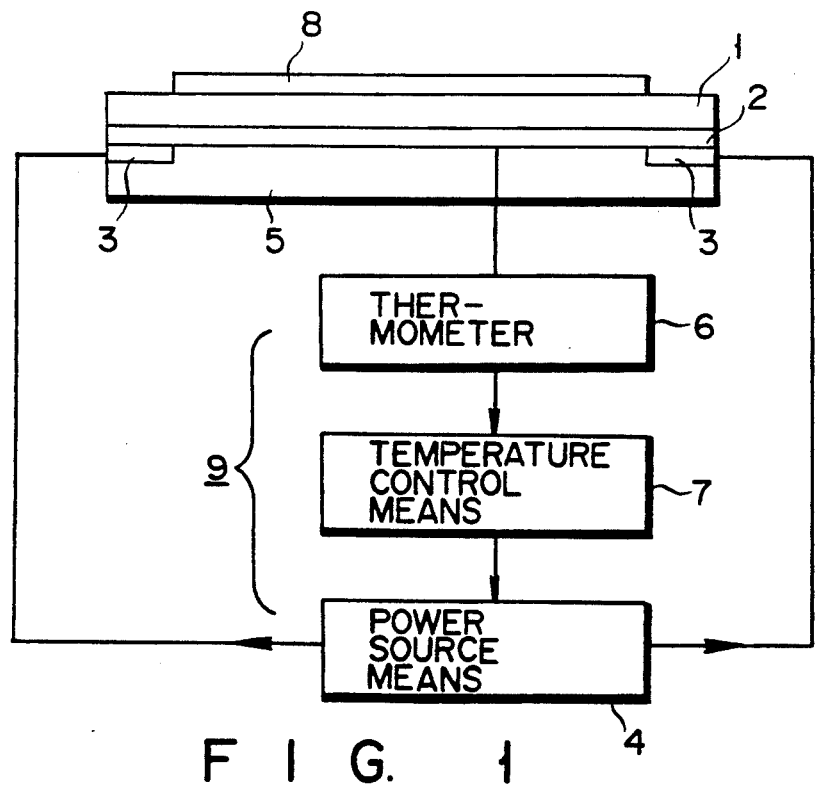
F I G. 1
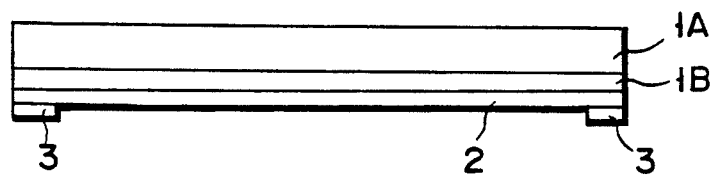
F I G. 2
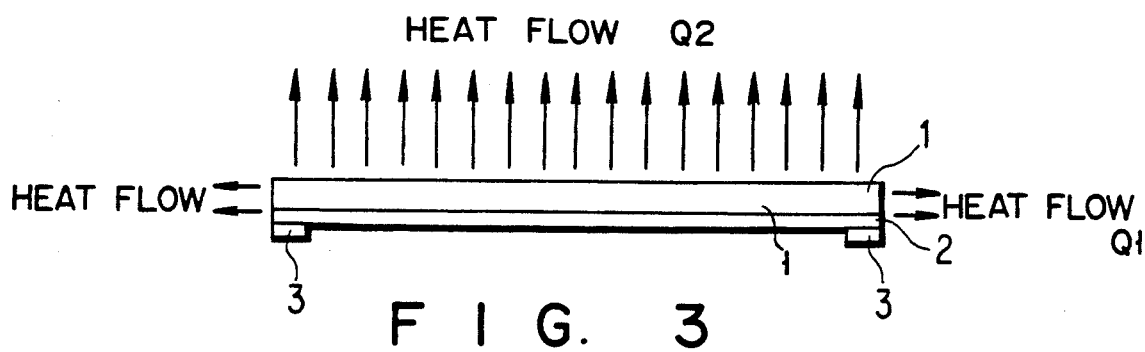
F I G. 3

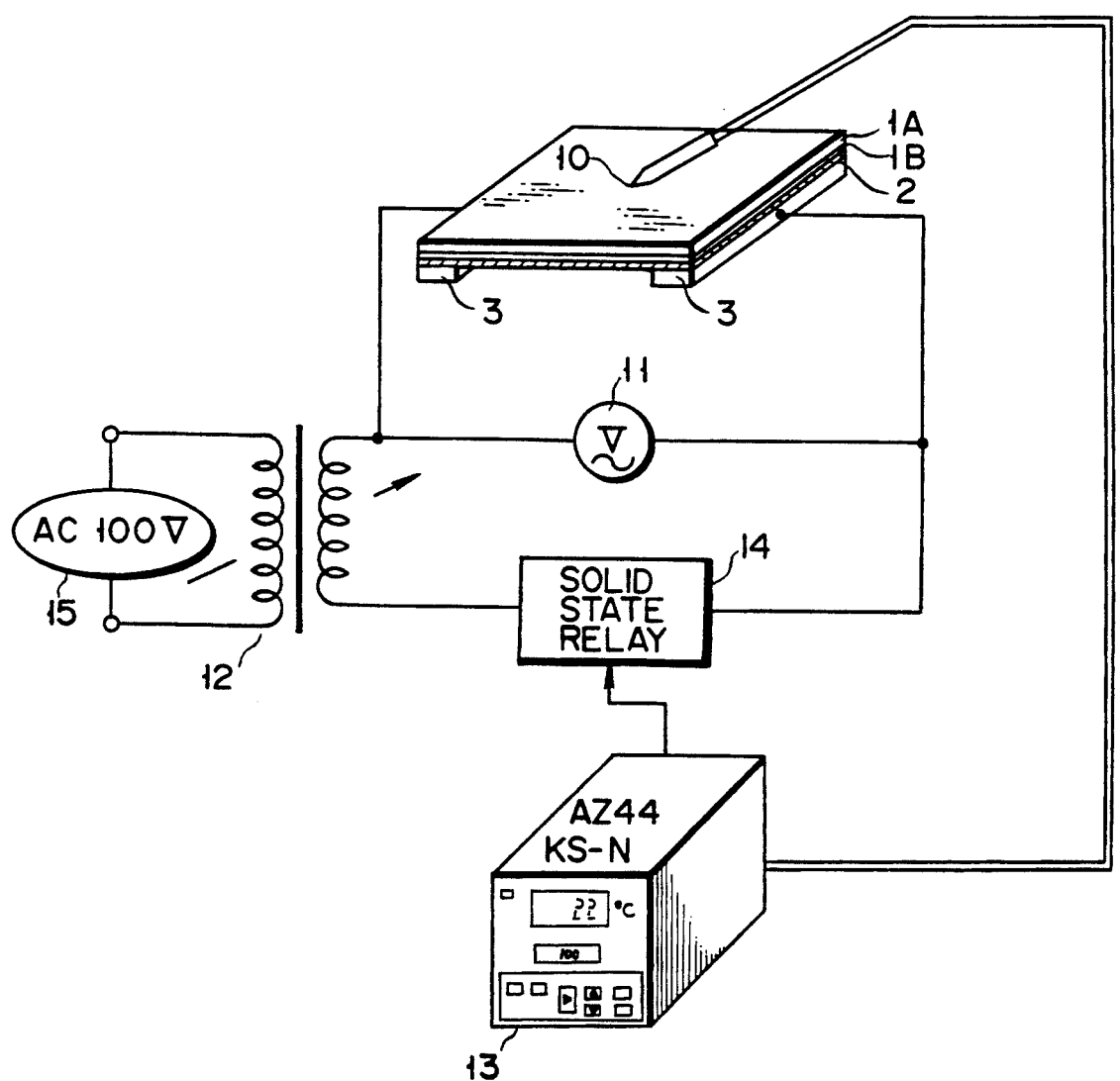
F I G. 5

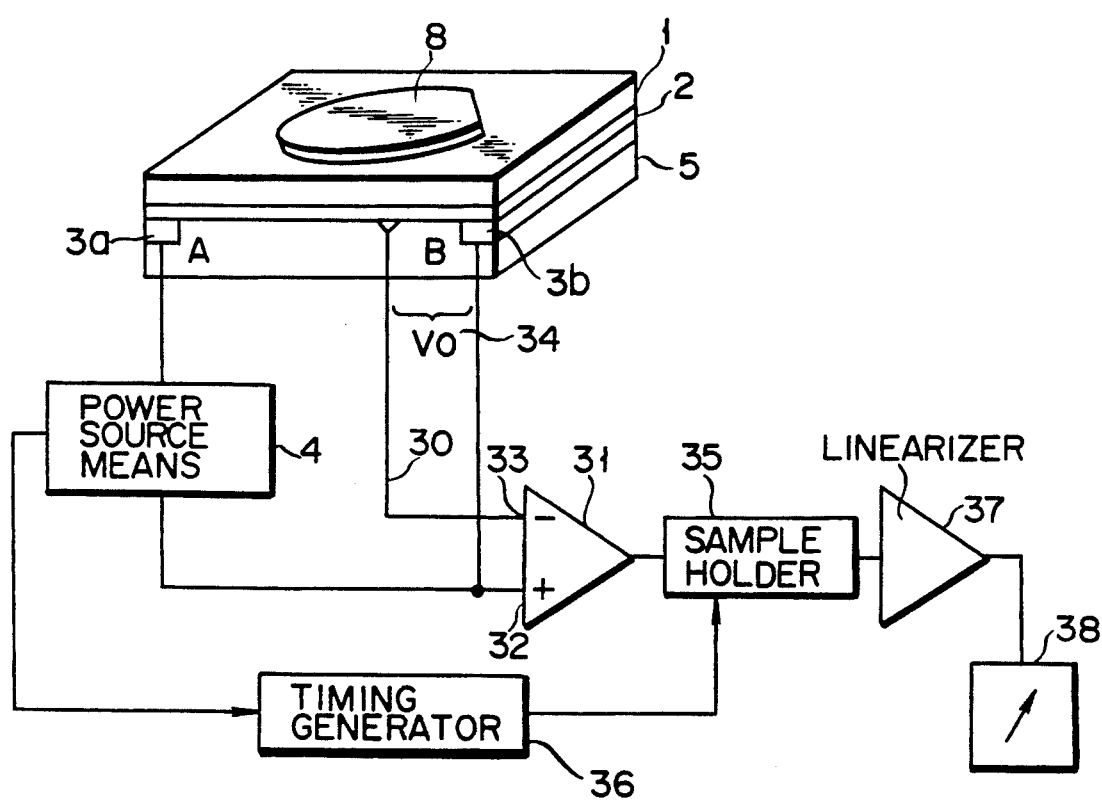
F I G. 9

5,225,663

HEAT PROCESS DEVICE

This application is a continuation of application Ser. No. 07/366,455, filed on Jun. 15, 1989, now abandoned.

BACKGROUND OF THE INVENTION

1. Field of the Invention

The present invention relates to a heat process device.

2. Description of the Related Art

The course of manufacturing semiconductor integrated circuits includes a baking process for heating semiconductor substrates after photo-resist film is applied to them or photo-resist film coated on them is exposed and developed. One of the heat process devices employed at the baking process is disclosed in preliminarily-publicated Japanese Patent Application No. 58-21332. This heat process device is directed to a semiconductor substrate under heat treatment on a heating plate or heat transfer plate for a predetermined time period at a certain temperature, while heating the heat transfer plate by a heating element or a heater housed in a heating substrate or a plate-like insulater. A heat process is thus applied to the photo-resist film on the semiconductor substrate.

This heat process device, however, has the following drawbacks.

The heating element for heating the heat transfer plate comprises arranging and sealing an electric resistance wire in a plate-like insulator or a heating substrate. The arrangement of the electric resistance wire is not uniform in relation to a heat source for heating of the heat transfer plate in this case. Therefore, the heat flux perpendicular to the surface of the heating plate becomes larger as the object heating point comes nearer to the electric resistance wire. When the heat transfer plate of a smaller width is heated by this SCATERED heat flux, temperature distribution on its surface does not become uniform. In order to uniformly apply heat process to the photo-resist film on the semiconductor substrate, therefore, it is required that the heat flux at the surface of the heat transfer plate is made uniform. This requires the heat transfer plate to be made thick so that the diffusion distance of heat can be made so long as to make the heat flux at the surface of the heating plate uniform. The surface temperature of the heat transfer plate can be thus made uniform.

When the heat transfer plate is made thick, however, the heat capacity of the heat transfer plate is increased and this makes it difficult to quickly raise and lower the surface temperature of the heat transfer plate. When the temperature of the thick heat transfer plate is to be raised, for example, it takes a long time until the surface of the heat transfer plate reaches a predetermined temperature after current is applied to the heat transfer plate. When higher current is added to the heat transfer plate to shorten the time during which the surface of the heat transfer plate is heated to the predetermined temperature, the heating temperature becomes too high to heat the heat transfer plate, that is, there is an over shoot in temperature. When the heat transfer plate which is made thick is to be cooled, the cooling of the heat transfer plate cannot be finished in a practical time period. In order to let the heat process device have a high heat process capacity, therefore, it is required that the heat transfer plate be made large-sized. This also makes the whole device large-sized and heavy.

Further, the heating element and the heating plate or the heat transfer plate are different parts, and indirectly contact via a very small gap. In general, there is a certain amount of the thermal contact resistance between them. The speed of transmitting heat from the heating element to the heating element depends greatly upon the thermal contact resistance of them at the time of assembly. As the result, heating capacity is different for every heat process device thus made. When the heat source is complicated in its structure, breaking of the resistance wire as well as inferior insulation may be caused, thereby lowering the reliability of the devices thus made.

SUMMARY OF THE INVENTION

The object of the present invention is therefore to provide a heat process device, which is small in size, easy to operate, and excellent in controlling heating temperature so as to apply uniform heat process to an object to be processed.

According to the present invention, there can be provided a heat process device comprising a film-like heating body being heated by a current supplied, electrodes arranged on the film-like heating body, and a system for supplying a predetermined amount of current to the electrodes.

BRIEF DESCRIPTION OF THE DRAWINGS

FIG. 1 shows an arrangement of the heat process device according to the present invention;

FIG. 2 shows an arrangement of the main portion of the heat process device according to the present invention;

FIG. 3 shows the heating section of the heat process device shown in FIG. 1;

FIG. 5 shows an arrangement of the test device for conducting temperature tests;

FIG. 9 shows another example of the heat process device according to the present invention, said device having a current supply system comprising a timing generator and the like;

DETAILED DESCRIPTION OF THE PREFERRED EMBODIMENTS

Figure 4:
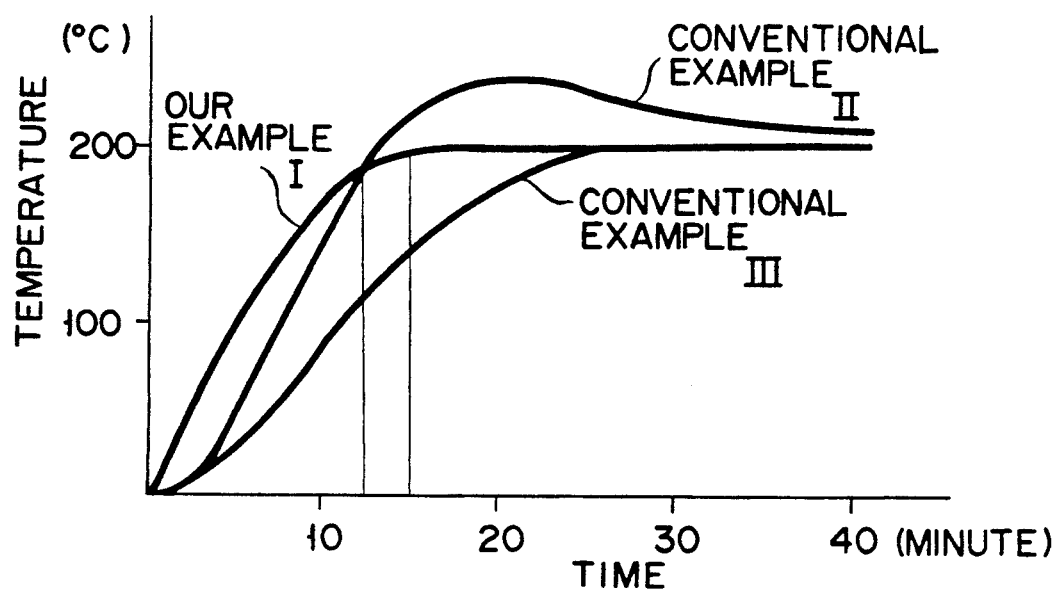
FIG. 4 is a graph showing the temperature raising characteristic of the heat process device shown in FIG. 1 and those of the conventional devices.

FIG. 1 shows an example of the heat process device according to the present invention. Numeral 1 denotes a heat transfer plate made of ceramics such as alumina having electric insulation and heat transmission. Thin conductive film 2 which serves as the heat source is formed on the surface of heat transfer plate 1. Thin conductive film 2 is made of chrome, for example.

Chrome film, 0.1-100 μm thick, preferably 0.5-2 μm thick, is vapor-deposited, as thin conductive film 2, on the surface of heat transfer plate 1. Strip-like electrodes 3 made of copper, for example, are formed at both side ends of thin conductive film 2. Electrodes 3 are connected to power supply box 4. Current is supplied from power supply box 4 to thin conductive film 2 through electrodes 3 to heat thin conductive film 2 and then heat transfer plate 1. Heat insulator 5 made of tetrafluoroethylene (or Teflon), for example, is formed on the surface of thin conductive film 2 as well as those of electrodes 3. The detecting terminal of thermometer 6 contacts the surface of thin conductive film 2, passing through heat insulator 5. Thermometer 6 is electrically connected to power supply box 4 through temperature control unit 7. Detection signals of thermometer 6 are supplied to temperature control unit 7. Power supply box 4 is controlled in response to signals applied from temperature control unit 7, so that current supplied to thin conductive film 2 can be set at a predetermined value. The surface temperature of heat transfer plate 1 can be thus set at a predetermined value. Thermometer 6, temperature control unit 7 and power supply box 4 cooperate to form current supply system 9.

Semiconductor wafer 8 which is an object to be processed is placed on the other side of heating plate 1 which is coated with no thin conductive film 2. Heat transfer plate 1 including heat insulator 5 and the like is attached to a stage (not shown). Pins for supporting and lifting semiconductor wafer 8 extend passing through heat transfer plate 1 including heat insulator 5 and the like. Semiconductor wafer 8 is loaded on and unloaded from heat transfer plate 1 by means of a carrier system (not shown).

As shown in FIG. 2, thin ceramic film 1B may be interposed between heat transfer plate 1A and thin conductive film 2. Heat transfer plate 1A is made of aluminium in the case of this heat process device. Thin ceramic film 1B, flame-sprayed, is interposed between heat transfer plate 1A and thin conductive film 2 to provide insulation between them. Even when the heat process device is arranged to have this composite structure, thin conductive film 2 can be easily attached to thin ceramic film 1B. This heat process device, therefore, can achieve the same heat process as in the case of the heat transfer plate made of ceramics only.

In the case of the heat transfer plate made of ceramics only, it depends upon the capacity of the ceramics sintering furnace how easily the heat transfer plate can be produced. As the heat transfer plate becomes larger and larger in size, therefore, its manufacture becomes more and more difficult and its cost rises. When the heat process device is made to have the composite structure shown in FIG. 2, thin ceramic film 1B can be attached to the heat transfer plate 1A by flame spraying and then thin conductive film 2 can be formed by vapor deposition. This makes it easy to assemble a heat process device capable of heating particularly large-sized semiconductor wafers 1B.

The operation of the heat process device arranged as shown in FIG. 1 will be described below.

A predetermined value of current is supplied to thin conductive film 2 by means of current supply system 9. Heat transfer plate 1 is thus heated to a predetermined temperature prior to placing semiconductor wafer 8 on heat transfer plate 1. The pins (not shown) are projected from the surface of heating plate 1. Semiconductor wafer 8 is then mounted on the pins projected. The pins are lowered, causing semiconductor wafer 8 to be placed on heat transfer plate 1 and held there by vacuum sucking. Semiconductor wafer 8 is heated to a predetermined temperature by heat transmitted from heating plate 1.

As shown in FIG. 3, only both side ends of heat transfer plate 1 are made thicker because of electrodes 3 located there. However, the whole underside of heat transfer plate 1 is directly coated with thin conductive film 2, including even those side ends of heat transfer plate 1 where electrodes 3 are located. That area of heat transfer plate 1 which is directly heated by thin conductive film 2 can be thus made wide enough. When semiconductor wafer 8, 8 inches in size, is to be heated, for example, heat transfer plate 1 can be made to have a length of 200 mm, a width of 200 mm and a thickness of 0.1-5 mm, preferably 1-2 mm.

Both side end areas of heat transfer plate 1 where electrodes 3 are located are quite small in the case of the heat process device shown in FIG. 1. Therefore, heat quantity $Q_1$ scattered outside from both side end areas of heat transfer plate 1 can be suppressed to be smaller than 5% of heat quantity $Q_2$ vertically flowing through heat transfer plate 1. Heat loss which is called end effect at the time of heating process can be thus suppressed to be negligible, thereby enabling the uniformity of surface temperature on heat transfer plate 1 to be enhanced.

When semiconductor wafer 8 on heat transfer plate 1 is heated to 100° C., for example, it has been confirmed that the temperature distribution on the surface of heat transfer plate 1 can be set to 100±1° C. in the case of the heat process device shown in FIG. 1. If the same effect is to be achieved by the conventional heat process device, it will be needed, considering the end effect, that the heat transfer plate be made 50 mm or more thick, 120 mm long and 120 mm wide and that it be made of aluminium. When it is made of aluminium, having the above-mentioned dimension, it will become 10-15 times heavier, as compared with heat transfer plate 1 of the heat process device shown in FIG. 1.

When thin conductive film 2 of the heat process device shown in FIG. 1 is made of a material whose electric resistance becomes smaller as the temperature becomes lower, the following effect can be attained. When thin conductive film 2 is heated, a larger current flows to that area of thin conductive film 2 where the temperature is relatively lower to that at the other area thereof. Temperature at the low-temperature area of thin conductive film 2 can be thus raised to a predetermined value at the same speed as at the other area thereof. When thin conductive film 2 is made of a certain material in the case of the heat process device shown in FIG. 1, therefore, the temperature can be raised at a uniform speed all overheat transfer plate 1. As the result, the heat process of semiconductor wafer 8 can be achieved with extremely high safety.

It will now be described how the surface temperature of semiconductor wafer 8, heat-processed by the heat process device shown in FIG. 1, changes as time goes by, referring to FIG. 4 in which test results obtained by the heat process device of the present invention and by the conventional ones are shown as a graph.

Tests were conducted using a test system shown in FIG. 5. The main portion of the heat process device comprised bonding thin ceramic film 1B and then thin conductive film 2 to one side of heat transfer plate 1A. Electrodes 3 were attached to both side ends of thin conductive film 2. AC voltmeter 11 and solid state relay 14 were electrically connected in parallel to paired electrodes 3. Power source 15 of AC 100 V was connected between AC voltmeter 11 and solid state relay 14 through variable transformer 12. Temperature adjuster 13 was connected to solid state relay 14. Detecting terminal of thin film thermocouple 10 which was connected to temperature adjuster 13 was contacted with the surface of heat transfer plate 1A. No atmospheric gas was purged onto the surface of heat transfer plate 1A.

Test were conducted as follows:

1) The test system was assembled and secondary voltage of variable transformer 12 was then set to OV.

2) Predetermined alternative current was supplied to electrodes 3.

3) It was then recorded how the surface temperature of heat transfer plate 1A detected by thin film thermocouple 10 changed as time passed.

Results represented by characteristic curve I in FIG. 4 were obtained in this manner. The same tests were conducted relating to the conventional heat process device (comparison example 1) provided with no thin conductive film and also relating to the conventional heat process device (comparison example 2) whose heat transfer plate was made thick. Their results were denoted by characteristic curves II and III, respectively in FIG. 4.

Tests were also conducted following steps 1) and 2) but current supply to thin conductive film 2 was stopped at step 3) and it was then recorded how the surface temperature of heat transfer plate 1A changed as time passed. Results thus obtained are shown by characteristic curve IV in FIG. 6. The same tests were conducted relating to comparison example 1 and results thus obtained are shown by characteristic curve V in FIG. 6.

In the case of the heat process device according to the present invention, the temperature rising time during which heat transfer plate 1A reached a predetermined temperature of 200° C. after the start of heating was about 15 minutes, as shown by characteristic curve I in FIG. 4. In the case of the comparison examples, they were about 60 minutes and about 30 minutes, respectively, as shown by characteristic curves II and III in FIG. 4. It was confirmed in the case of the heat process device according to the present invention that the surface temperature of heat transfer plate 1A could be easily raised to 200° C. when current of about 400 W was supplied ($P = V^2/R = 100^2/25 = 400$). In the case of the conventional heat process device provided with no thin conductive film (comparison example 1) whose results were shown by characteristic curve II in FIG. 4, however, current of about 450 W was needed to raise the surface temperature of the heating plate to 200° C.

It can be found in the case of the heat process device according to the present invention that the object to be processed can be heated to the predetermined temperature with a smaller heat capacity and for a shorter time period, as compared with those in the case of the conventional heat process devices, and that the demerit of overshoot caused by heating is negligible. In the case of the comparison examples having characteristic curves II and III in FIG. 4, however, the temperature rising time during which the surface temperature of the heat transfer plate reaches the predetermined temperature after the start of heating was longer and it also takes a longer time for the heat transfer plate to reliably keep its surface at the predetermined temperature. It can be, therefore, found that a larger heat capacity and a longer time are needed to raise the object to be processed to the predetermined temperature and that the demerit of overshoot is likely to be caused. For the purpose of raising the surface temperature of the heat transfer plate while making the overshoot caused by heating as negligible as possible, the heat transfer plate must be heated to slowly reach the predetermined temperature, as apparent from characteristic curve III in FIG. 4. It can be therefore found that quick heat process cannot be applied to the object.

Figure 6:
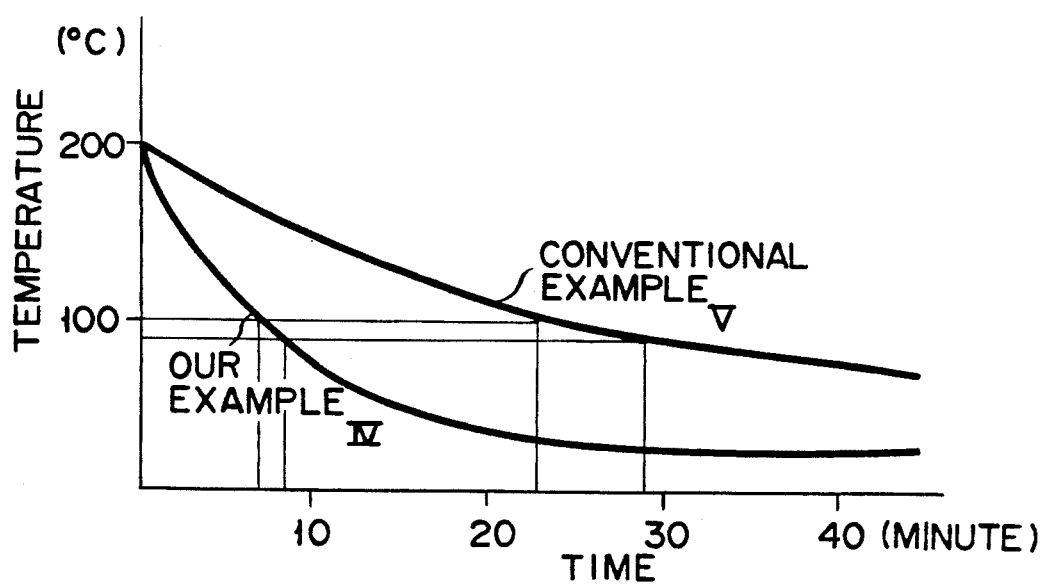
FIG. 6 is a graph showing the temperature lowering characteristic of the heat process device shown in FIG. 1 and that of the conventional device.

As apparent from characteristic curve IV in FIG. 6, extremely quick lowering of temperature can be attained with the heat process device of the present invention. It has been confirmed that temperature lowering from 100° C. to 95° C. can be achieved in 5 minutes or less. In the case of the conventional heat process device (or comparison example 1), however, temperature lowering is quite slow, as apparent from characteristic curve V in FIG. 6. It has been confirmed that 4 minutes or more are needed to lower the surface temperature of the heat transfer plate from 100° C. to 95° C.

As described above, the heat process device of the present invention enables the object to be quite well heat-processed, quickly lowering or raising its temperature.

Using the test system shown in FIG. 5, test were conducted relating to temperature distribution on the surface of heat transfer plate 1A.

Figure 7:
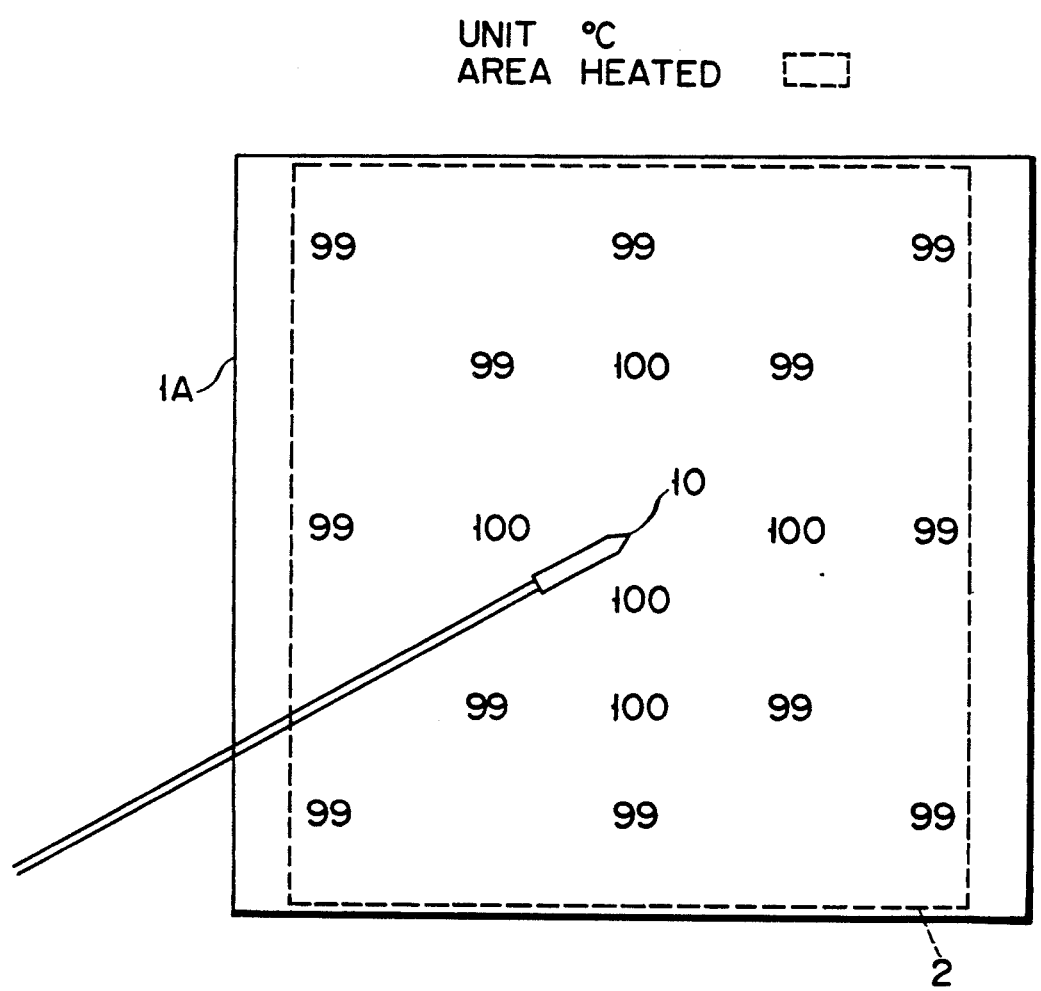
FIG. 7 shows temperature distribution on the surface of the heat transfer plate.

Temperature adjuster 13 was switched on and off. The predetermined temperature was 100° C. and heat transfer plate 1A was heated to this temperature. When the surface temperature of heat transfer plate 1A became stable enough, temperature was measured at 17 optional points on the surface of heat transfer plate 1A by means of thin film thermocouple 10, as shown in FIG. 7. Results thus obtained were denoted by figures in FIG. 7. As apparent from FIG. 7, it was confirmed that temperature was 99–100° C. almost all over the surface of heat transfer plate 1A same as that of the conventional heat process device.

Figure 8:
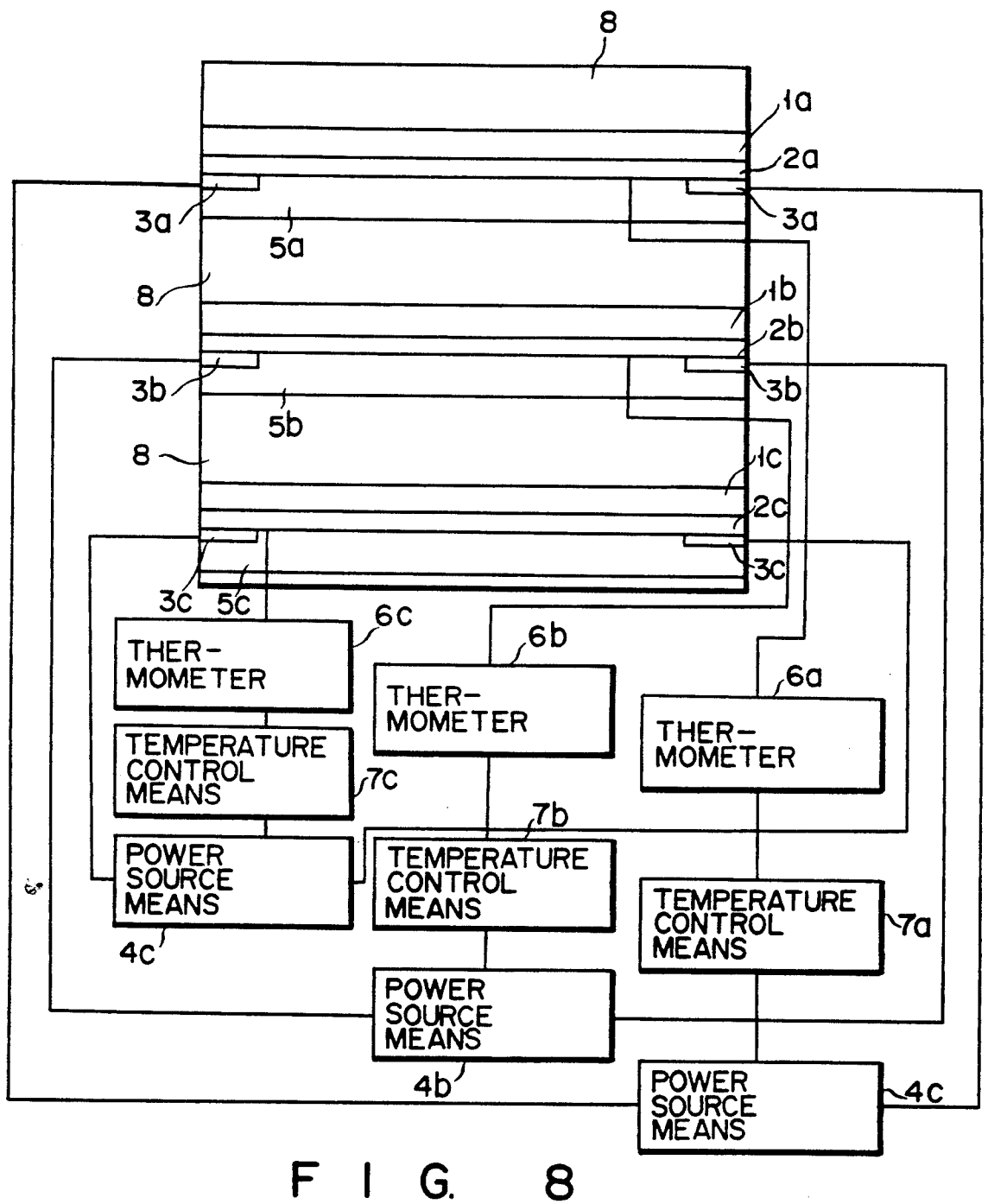
FIG. 8 shows another example of the heat process device according to the present invention.

Another example of the heat process device according to the present invention will be described now referring to FIG. 8. This heat process device comprises piling three heat process devices shown in FIG. 1 one upon the other to heat-process three pieces of semiconductor wafers 8 at the same time. Three pieces of semiconductor wafers 8 are placed on heat transfer plates 1a, 1b and 1c, respectively. Thin conductive films 2a, 2b and 2c are bonded to the undersides of heat transfer plates 1a, 1b and 1c, respectively. Paired electrodes 3a, 3b and 3c are attached to both side ends of thin conductive films 2a, 2b and 2c, respectively. Heat insulators 5a, 5b and 5c are bonded to the surfaces of thin conductive films 2a, 2b and 2c, respectively, covering paired electrodes 3a, 3b and 3c thereon, too. Terminals of thermometers 6a, 6b and 6c are connected to surfaces of thin conductive films 2a, 2b and 2c. Thermometers 6a, 6b and 6c are connected to power supply box 4a, 4b and 4c through temperature control units 7a, 7b and 7c, respectively, to form current supply systems 9a, 9b and 9c. As seen in the case of the heat process device shown in FIG. 1, semiconductor wafers 8 are heat-processed rendering current supply systems 9a, 9b and 9c operative.

When the heat process devices are piled one upon the other in this manner, all of them can be small-sized. In addition, plural pieces of the semiconductor wafers can be extremely efficiently heat-processed.

A further example of the heat process device which uses voltage amplifier 31, timing generator 36 and the like to form the current supply system will be described now referring to FIG. 9.

Electrodes 3a and 3b are made of copper, for example. One electrode 3a is electrically connected to power supply box 4 while the other electrode 3b to a wiring which connects power supply box 4 to the plus side of voltage amplifier 31. Power supply box 4 can change the amount of current to supply by varying the time length of current supply which starts with the beginning of one cycle when one second, for example, is deemed as the one cycle. Power supply box 4 supplies current to thin conductive film 2 through electrodes 3a and 3b to heat transfer plate 1 to a predetermined temperature. In short, power supply box 4 is driven responsive to pulses.

Heat insulator 5 made of tetrafluoroethylene, for example, covers thin conductive film 2 and electrodes 3a and 3b.

One end of temperature measuring lead line 30 is attached to thin conductive film 2 at a certain position thereof adjacent to one electrode 3b by bonding, soldering or the like. The voltage of a thermoelectromotive force caused between thin conductive film 2 and electrodes 3a, 3b can be detected between temperature measuring lead line 30 and electrode 3a or 3b.

Electrode 3b is connected to plus input 32 of voltage amplifier 31 which is an operational amplifier having a high input impedance. The other end of temperature measuring lead line 30 is connected to minus input 33 of voltage amplifier 31. Voltage Vo between temperature measuring lead line 30 and electrode 3b is received as an input, which is amplified and then fed as an output.

The output of voltage amplifier 31 is applied to sample holder 35, which samples the output of voltage amplifier 31 responsive to timing signals applied from timing generator 36 which is connected to power supply box 4. Sample holder 35 holds this output until a next sampling process is started. The output of sample holder 35 has a nonlinear characteristic. This output is supplied to linearizer 37 where it is converted to have a linear characteristic. It is also converted to approximate an output level which corresponds to the magnitude of the voltage Vo or thermoelectromotive force between temperature measuring lead line 30 and electrode 3b. It is then outputted through linearizer 37.

This output is analog-displayed by the pointer type meter to show temperature or is converted from analog to digital and then digital-displayed on display 38 to show temperature. It is also fed back to power supply box 4 and used as a signal for controlling temperature.

A substrate or semiconductor wafer 8 which has been coated by a layer of photoresist is placed on the side of heat transfer plate 1 on which no thin conductive film 2 is formed, and it is then heat-processed.

Before semiconductor wafer 8 is placed on heat transfer plate 1, current is supplied to thin conductive film 2 through electrodes 3a and 3b by power supply box 4 to heat transfer 1 to a predetermined temperature.

Pins (not shown) are projected from the top of heat transfer plate 1 and resist-coated semiconductor wafer 8 carried by carrier system (not shown) is mounted on top of the pins. The pins are then lowered to place semiconductor wafer 8 on heat transfer plate 1. Semiconductor wafer 8 is sucked and held on heat transfer plate 1 and heated to the predetermined temperature of 200° C., for example, by heat transmitted from heat transfer plate 1.

It will now be described how the heating temperature is controlled.

Figure 10:
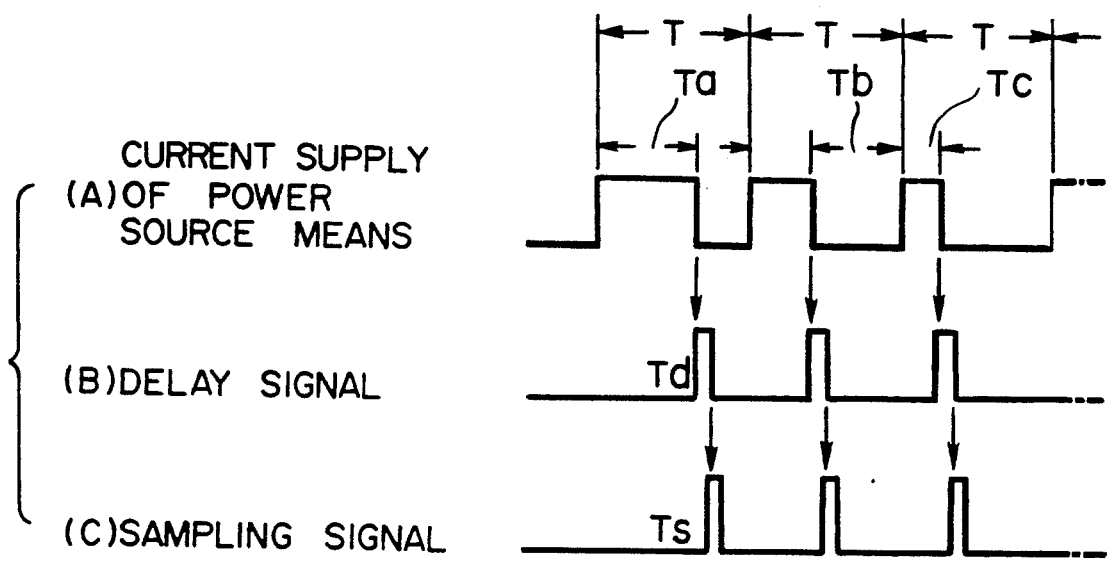
FIG. 10A shows signals generated while current is being supplied by a power source means shown in FIG. 9.
FIG. 10B shows delay signal.
FIG. 10C shows sampling signal.

Current supply is made from power supply box 4 to thin conductive film 2, responding to pulses applied as shown in FIG. 10A. It is set that cycle T equals 1 second, and a current supply starts at the same time when every cycle begins. Current supplied to thin conductive film 2 is controlled by varying this current supply time. $T_A$, $T_B$, $T_C$ and current supplied every cycle is reduced more and more in a case shown in FIG. 10A.

The timing signal for allowing current to be supplied is inputted to timing generator 36, where a delay signal having time length Td of about 10 ms is generated every time the timing signal falls, as shown in FIG. 10B.

The sampling signal having time length Ts of about several microns is then generated every time the delay signal falls, as shown in FIG. 10C. The sampling signal is inputted to sampling holder 35.

The delay signal is intended to make it possible that the voltage of thermoelectromotive force is sampled when no influence of current supply is left at all after the current supply of power supply box 4 is stopped. Current supply is controlled in such a way that the total sum of current supply time $T_A$, time length Td of the delay signal, and time length Ts of the sampling signal is within one cycle T (or 1 second) and that no influence is added to the voltage of thermoelectromotive force.

Thin conductive film 2 is heated by current supplied from power supply box 4 through electrodes 3a and 3b. Because the junctions of electrodes 3a and 3b with thin conductive film 2 are heated, thermo-electromotive force is created, due to thermoelectric effect, between thin conductive film 2 and electrodes 3a, 3b.

This thermoelectromotive force is detected between electrode 3b and temperature measuring lead line 30. Voltage Vo detected is amplified by voltage amplifier 31, which has a high input impedance, and then inputted to sample holder 35.

When the sampling signal is inputted, sample holder 35 samples the output voltage value of voltage amplifier 31 and holds it until a next sampling signal is inputted to sample holder 35. Therefore, the output of sample holder 35 appears as a discontinuous step-like waveform.

the output of sample holder 35 is inputted to linearizer 37, where the discontinuous step-like output voltage is converted to a continuous analog amount which corresponds to voltage Vo of thermoelectromotive force, which is then outputted.

This output voltage is analog-displayed by the pointer type meter or converted to digital figures and then digital-displayed on display 38 to show a temperature.

The output voltage value of linearizer 37 is fed back to power supply box 4, for example, and the temperature measured to lower than the previously set temperature, power supply box 4 is controlled to make longer its time of supplying current to thin conductive film 2 to raise the temperature measured. When the temperature measured to higher than the set temperature, however, power supply box 4 is controlled to make shorter its time of supplying current to thin conductive film 2 to lower the temperature measured. The temperature of thin conductive film 2 can the be automatically adjusted to the set temperature in this manner.

As apparent from the above, no temperature measuring element is needed because thin conductive film 2 which is a film-like heating member can be used as the temperature measuring element. This enables measurement and control of temperature to be conducted with high accuracy.

Figure 11:
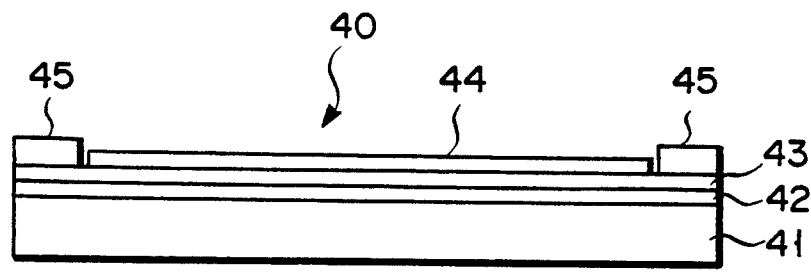
FIG. 11 shows another example of the heat process device according to the present invention.

Heat process device 40 having such a main portion as shown in FIG. 11 is a further embodiment of the present invention. Numeral 41 represents a heat insulation member. Insulation layer 42, film-like heating body 43 and insulation layer 44 are successively piled one upon the other in this order on that side of heat insulation member 41 on which the object to be processed is mounted. Electrodes 45 are formed on and along both side rims of film-like heating body 43, contacting both side end faces of insulation layer 44.

The heat capacity of insulation layer 42 can be made extremely small in this case. Therefore, the response of film-like heating body 43 to current applied can be enhanced remarkably. On the other hand, the thermal diffusivity of the base (or insulation layer 42) which is coated with film-like heating body 43 becomes far less important. Therefore, this base can be made of heat insulation material such as ceramics and resins.

When the heat process is to be carried out at high temperature, using heat process device 40, mechanically strong and stable stainless steel can be used as the material of the base.

Insulation layer 44 formed on film-like heating body 43 can be made of alumina, for example, which has a high infrared emission rate. This can realize an infrared heating means.

The thin conductive film which is a component of the heat process device according to the present invention may be made of a metal such as chrome, nickel, platinum, tantalum, tungsten, tin, iron, copper, Alumel, beryllium, antimony, indium, chromel, cobalt, strontium, rhodium, palladium, magnesium, molybdenum, lithium and rubidium, or a material of the carbon type such as carbon black and graphite, or an alloy such as nichrome, stainless steel, bronze and brass, or a composite material of the polymer group such as polymer graft carbon, or a composite ceramic material such as molybdenum silicide. The material of which the thin conductive film is made may have conductivity and serve as a heating resistance to form a heat source when current is supplied to this material. It may depend upon the heat process temperature employed as to which of the abovementioned materials is selected as the material of the thin conductive film.

Vapor deposition, chemical vapor deposition, sputtering, thermal spraying, ion implantation, ion plating or the like may be used, depending upon the material of which the thin conductive film is made, to attach the thin conductive film to the heat transfer plate.

The heat transfer plate may be made of a material excellent in heat conductivity and electric insulation. As such a material for the heat transfer plate, there can be cited ceramics such as alumina, zirconia, silicon carbonite, silicon nitride and diamond, or metal oxide such as quartz and rutile, or brick such as high alumina brick and carbon brick.

Objects which ca be heat-processed by the heat process device according to the present invention include semiconductor wafers on which a resist film has been formed, those coated with developing liquid, and those which are to be subjected to ashing, etching, chemical vapor depositing, sputtering process, or annealing. The heat process device of the present invention is also intended for heating liquid crystal devices, drying film coated, heating plastic materials when they are surface-processed prior to their bonding process, and drying printing resisters.

According to the present invention as described above, a desirable heat process can be smoothly and easily applied to resist-film-coated semiconductor wafers while keeping the surface temperature of the heat transfer plate uniform. In addition, the heat process device can be made extremely thin as compared with the conventional ones. The heat capacity of the heat transfer plate can be thus made smaller. This enables different heat process temperatures to be more quickly set with better respondency. Further, the heat transfer plate can be made smaller in size and lighter in weight. This enables the whole of the heat process device to be made more compact.

Furthermore, the heat transfer plate and the heat source can be made integral and simple in construction because of the thin conductive film used. Therefore, electric heating resistance at the joint of the heat transfer plate with the heat source can be reduced to some great extent and such accidents as line breaking of the heat source can be prevented. As the result, the reliability of the heat process device can be enhanced.

What is claimed is:

1. A heat process device comprising:
   plural heat process units piled one upon the others at a certain interval, each of said heat process units including a heat transfer plate on one side of which an object to be processed is mounted; a film-like heating body attached to the other side of the heat transfer plate; electrodes attached to the film-like heating body; and a system for supplying a predetermined amount of current to the electrodes.

2. The heat process device according to claim 1, wherein said object to be processed is a semiconductor wafer, a liquid crystal device or a printing resister.

3. A heat process device comprising:
   a heat transfer plate on one side of which an object to be processed is mounted,
   a film-like heating body formed on this one side of said heat transfer plate,
   electrodes formed on and along both side edges of said film-like heating body,
   a means for supplying a predetermined amount of current to said electrodes, and
   an insulation layer formed not on said electrodes but on said film-like heating body.

4. A heat process device comprising plural heat process units piled one upon the other at a certain interval, said heat process unit including a heat transfer plate on one side of which an object to be processed is mounted, a film-like heating body formed on this side of said heat transfer plate, electrodes formed on and along both side rims of said film-like heating body, a means for supplying a predetermined amount of current to said electrodes, and an insulation layer formed not on said electrodes but on said film-like heating body.

5. The heat process device according to any of claims 3 and 4, wherein said insulation layer formed on the film-like heating is made of a material selected from the group consisting of: alumina, zirconia, silicon carbonite, silicon nitride, quartz, rutile, high alumina brick and carbon brick.

* * * * *